(12) United States Patent
Rhee et al.

(10) Patent No.: US 6,774,038 B2
(45) Date of Patent: Aug. 10, 2004

(54) ORGANOMETAL COMPLEX AND METHOD OF DEPOSITING A METAL SILICATE THIN LAYER USING SAME

(75) Inventors: Shi-Woo Rhee, Pohang-si (KR); Sang-Woo Kang, Seoul (KR); Won-Hee Nam, Pohang-si (KR)

(73) Assignee: Postech Foundation (KR)

( * ) Notice: Subject to any disclaimer, the term of this patent is extended or adjusted under 35 U.S.C. 154(b) by 0 days.

(21) Appl. No.: 10/423,337

(22) Filed: Apr. 25, 2003

(65) Prior Publication Data

US 2003/0203126 A1 Oct. 30, 2003

(30) Foreign Application Priority Data

Apr. 25, 2002 (KR) .................... 10-2002-0022641

(51) Int. Cl.$^7$ ............................ H01L 21/44
(52) U.S. Cl. ...................... 438/680; 438/681
(58) Field of Search ................... 438/680–681

(56) References Cited

U.S. PATENT DOCUMENTS

| | | | | |
|---|---|---|---|---|
| 6,106,898 A | * | 8/2000 | Takamatsu et al. | 427/255.21 |
| 6,399,208 B1 | * | 6/2002 | Baum et al. | 428/446 |
| 6,521,911 B2 | * | 2/2003 | Parsons et al. | 438/482 |

* cited by examiner

Primary Examiner—Lynne Gurley
(74) Attorney, Agent, or Firm—Anderson Kill & Olick, PC

(57) ABSTRACT

The present invention relates to an organometal complex and a chemical vapor deposition (CVD) or atomic layer deposition (ALD) method for preparing a metal silicate thin layer using same. The inventive method can easily prepare the metal silicate thin layer having a desired composition which can be effectively used as a gate insulating layer for various semiconductor devices.

7 Claims, 4 Drawing Sheets

ORGANOMETAL COMPLEX AND METHOD OF DEPOSITING A METAL SILICATE THIN LAYER USING SAME

FIELD OF THE INVENTION

The present invention relates to an organometal complex and a chemical vapor deposition (CVD) or atomic layer deposition (ALD) method for preparing a metal silicate thin layer using same.

BACKGROUND OF THE INVENTION

As semiconductor devices become more highly integrated, electrostatic capacitance becomes smaller in proportion to the size reduction of memory devices. Although the electrostatic capacitance can be increased by reducing the thickness of a gate insulating layer, a silicon oxide gate layer previously used in the art gives problems associated with increases in the channel electric field, interface trap concentration, and leakage current.

To solve such problems, several attempts have been made to develop a dielectric material for a gate insulating layer having higher dielectric constant than silicon dioxide, low leakage current and low interface density. In particular, silicate has been considered to be a promising candidate for a new dielectric material having high performance characteristics.

There have been reported several methods for depositing a metal silicate insulating layer by atomic layer chemical vapor deposition (ALCVD) (M. Ritala, K. et al., *Science* 299:319, 2000; Roy G. Gorden, et al., *Chem. Mater.* 13:2463, 2001). However, these methods require the use of two precursors, a metal precursor and a silicon precursor, which have similar decomposition characteristics. Further, the thin layer prepared by such methods often contain an unacceptable certain level of impurities.

The present inventors have therefore endeavored to develop an improved method for depositing a metal silicate gate insulating layer by ALD using a precursor containing both silicon and metal.

SUMMARY OF THE INVENTION

Accordingly, an object of the present invention is to provide an organometal complex and a chemical vapor deposition or atomic layer deposition method for preparing a metal silicate thin layer using same.

In accordance with one aspect of the present invention, there is provided a method for atomic layer deposition (ALD) of a metal silicate thin layer which comprises contacting the vapor of an organometal complex of Formula 1 with a substrate:

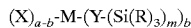  <Formula 1> wherein M is a trivalent metal ion such as Al, La and Bi, or a tetravalent metal ion such as Zr and Hf;
R is $C_{1-4}$ alkyl;
X is halogen or $C_{1-4}$ alkyl;
Y is O or N;
a is 3 and b is an integer ranging from 1 to 3 when M is a trivalent metal ion, or a is 4 and b is an integer ranging from 1 to 4 when M is a tetravalent metal ion; and
m is 1 when Y is O, or m is 2 when Y is N.

In accordance with another aspect of the present invention, there is provided an organometal complex of Formula 2 and a preparing method thereof.

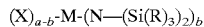  <Formula 2> wherein M, R, X, a and b are the same as defined above.

BRIEF DESCRIPTION OF THE DRAWINGS

The above and other objects and features of the present invention will become apparent from the following description of the invention, when taken in conjunction with the accompanying drawings which respectively show.

DETAILED DESCRIPTION OF THE INVENTION

Figure 1:
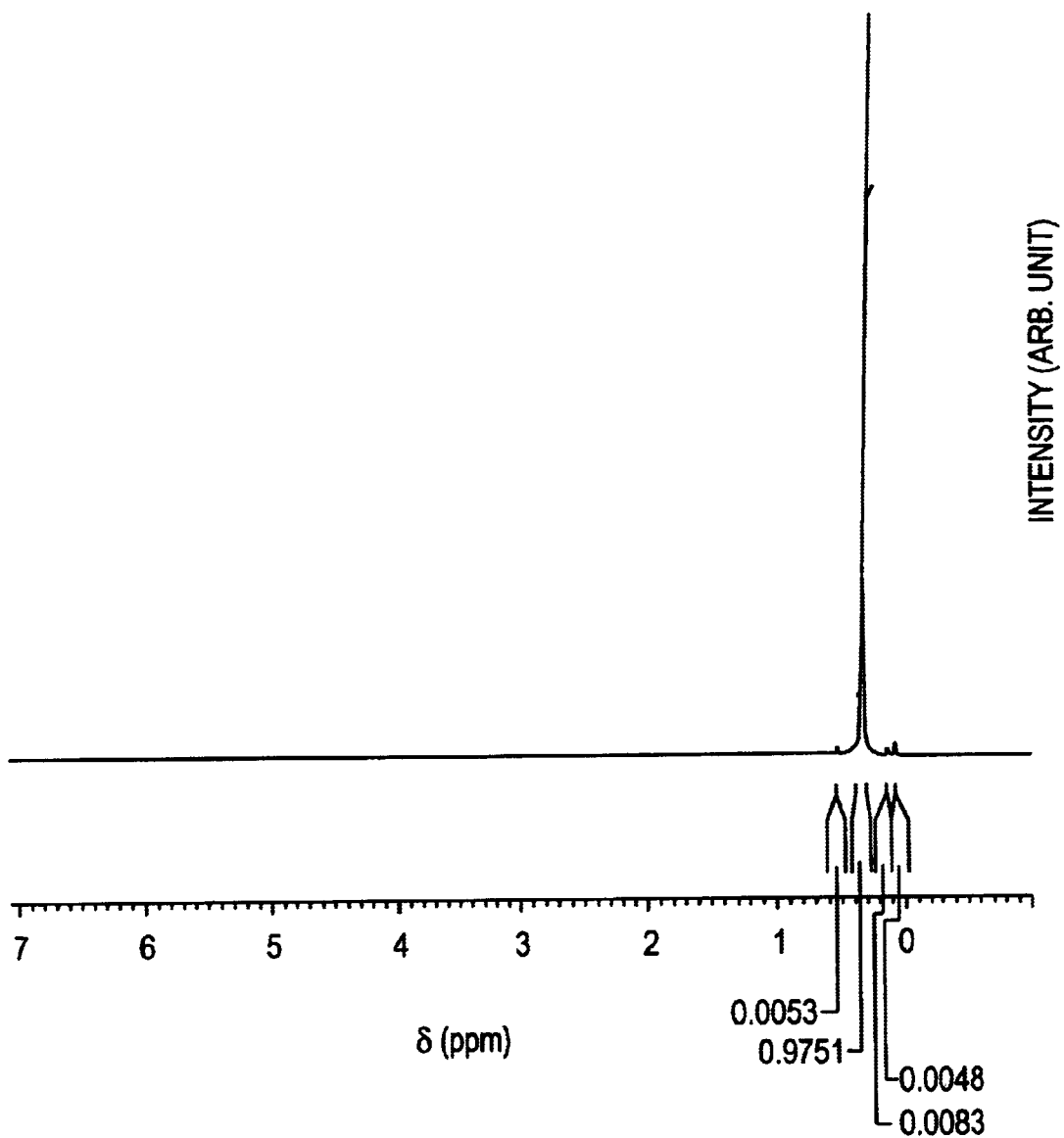
FIG. 1: $^1$H-NMR scan of $ZrCl_2(N(Si(CH_3)_3)_2)_2$ obtained in Example 1.

In accordance with the inventive method, a metal silicate thin layer can be easily deposited on a substrate by contacting an organometal complex of Formula 1 with the substrate.

In the organometal complex of Formula 1, M is a trivalent or a tetravalent metal ion selected from the group consisting of Al, La, Bi, Zr and Hf; R is $C_{1-4}$ alkyl, preferably methyl; X is halogen or $C_{1-4}$ alkyl; and Y is O or N; while a and b vary depending on M, respectively. In case M is a trivalent metal ion, a is 3 and b is an integer ranging from 1 to 3. In case M is a tetravalent metal ion, a is 4 and b is an integer ranging from 1 to 4. m is 1 when Y is O, or m is 2 when Y is N. The organometal complex of Formula 1 is stable and has improved stability and reacts readily with water or a reaction gas such as hydrogen. The organometal complex used in the inventive method includes $Zr$—$(OSi(CH_3)_3)_4$, $Zr$—$(N(Si(CH_3)_3)_2)_4$, $ZrCl_2(OSi(CH_3)_3)_2$ $ZrCl_2(N(Si(CH_3)_3)_2)_2$, $Hf$—$(OSi(CH_3)_3)_4$, $Hf$—$(N(Si(CH_3)_3)_2)_4$, $HfCl_2(OSi(CH_3)_3)_2$, and $HfCl_2(N(Si(CH_3)_3)_2)_2$.

The particular oganometal complex of Formula 1 in which Y is N and m is 2 is new and has structure of Formula 2. The organometal complex of Formula 2 is selected from the group consisting of $Zr$—$(N(Si(CH_3)_3)_2)_4$, $ZrCl_2$-$(N(Si(CH_3)_3)_2)_2$, $Hf$-$(N(Si(CH_3)_3)_2)_4$ and $HfCl_2$-$(N(Si(CH_3)_3)_2)_2$. The organometal complex of Formula 2 may be prepared by reacting compound of Formula 3 with compound of Formula 4 under a reflux condition in an organic solvent such as toluene. The compounds of Formulas 3 and 4 may be reacted in a molar ratio of 1:1 to 1:4.

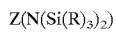  <Formula 3>

  <Formula 4> wherein R, M and X are the same as defined above;
Z is a monovelent metal ion;
c is 3 when M is a trivalent metal ion, and c is 4 when M is a tetravalent metal ion.

Metal organic chemical vapor deposition (MOCVD), chemical vapor deposition by direct liquid injection or using a bubbling delivery system, or atomic layer chemical vapor deposition (ALCVD) can be conducted to deposit the metal silicate thin layer of the present invention. ALCVD is preferred for the reasons that: it can regulate the layer thickness at the atomic layer level; it gives an excellent layer coverage; and it prevent gaseous prereaction.

In the preferred embodiment of performing ALCVD, a precursor gas of Formula 1 (source gas) may be contacted with a substrate heated to a temperature ranging from 200 to 700° C., preferably from 250 to 450° C. Further, under a reactor pressure ranging from 0.01 to 10 torr, a source gas may be injected at a rate of 0.1 to 10 sec per cycle, and a purge gas may be injected at a rate of 0.1 to 20 sec per cycle into a reactor equipped with a substrate. Thereafter, a reaction gas such as oxygen or water vapor may be injected at a rate of 0.1 to 10 sec per cycle. At this time, the source gas flow can be controlled by a flow regulator, and the vapor pressure (injecting amount) of the source gas can be changed by regulating the container temperature.

The inventive deposition method may further comprise contacting the vapor of oxidant with the substrate to increase silicon content in the thin layer. Preferably, the oxidant is a metal alkoxide complex of Formula 5.

$$M(OR)_d \qquad \text{<Formula 5>}$$

wherein M is a trivalent or a tetravalent metal ion;

R is $C_{1-4}$ alkyl; and d is 3 when M is a trivalent metal ion, or 4 when M is a tetravalent metal ion.

The substrate used in the inventive method may be any one of ordinarily used in the art, and preferably includes platinum, $SiO_2$, TiN, silicon and others.

The inventive deposition method using the organometal complex of Formula 1 as a single precursor has several advantages compared with the previously reported deposition method using two precursors in that: the deposition process can be simplified, the time required to perform deposition can be also reduced, and the thin layer composition can be easily regulated by changing the deposition condition. Accordingly, the inventive method can be advantageously used to prepare a metal silicate thin layer having a desired composition, and the metal silicate thin layer thus obtained can be effectively applied for fabricating various semiconductor devices such as a gate insulating layer.

The following Examples and Test Examples are given for the purpose of illustration only, and are not intended to limit the scope of the invention.

EXAMPLE 1

Preparation of $ZrCl_2(N(Si(CH_3)_3)_2)_2$ 14 g of $Li(N(Si(CH_3)_3)_2)$ dissolved in 200 ml of toluene was added to 11.6 g of $ZrCl_4$ held in a 500 ml Schelenk flask. When the reaction mixture became brown, it was refluxed under a nitrogen atmosphere for 1 day. While maintaining a nitrogen atmosphere, the reaction mixture was filtrated twice to obtain a transparent orange colored filtrate, and the solvent was removed from the filtrate under a reduced pressure, to give a viscous brown liquid, a crude product. The crude product was subjected to purification by vacuum distillation to obtain a viscous colorless liquid (75% yield).

$^1$H-NMR of the compound thus obtained is shown in FIG. 1. Based on the result of FIG. 1, it has been confirmed that the compound was $ZrCl_2(N(Si(CH_3)_3)_2)_2$.

EXAMPLE 2

Deposition of a Zirconium Silicate Thin Layer Using $Zr\text{—}(OSi(CH_3)_3)_4$

A zirconium silicate layer  ($Zr_xSi_{3-x}O_y$, wherein $1 \leq x \leq 3$, and $4 \leq y < 8$) was formed on a Si substrate using an ALCVD apparatus (self manufactured), using $Zr\text{—}(OSi(CH_3)_3)_4$ (Gelest) as a source gas, argon as a carrier/purge gas, and hydrogen as a reaction gas. ALCVD was conducted under the following condition: 1 torr reactor pressure, 20 sccm carrier gas flow rate, 500 sccm purge gas flow rate, 200 sscm reaction gas flow rate, 120° C. bubbler temperature, 130° C. inlet temperature, and 1:2:1 seconds injection times (source gas:purge gas:reaction gas). The deposition temperature was alternatively varied among 250, 300, 350, 400, 450 and 500.

Figure 2:
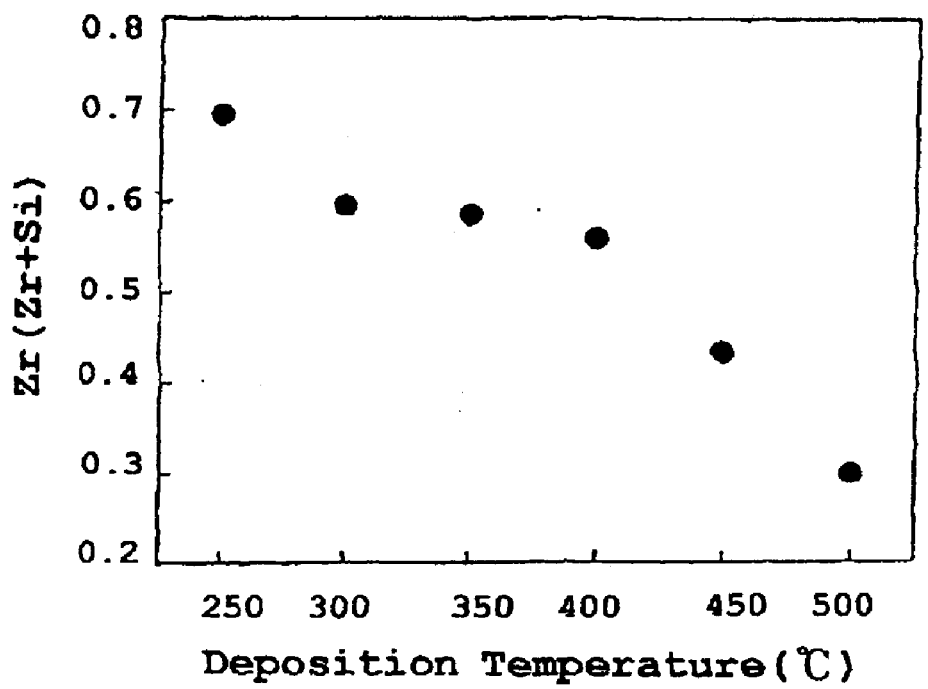
FIG. 2: the change in the zirconium content of the zirconium silicate thin layer obtained in Example 2 with deposition temperature.
Figure 3:
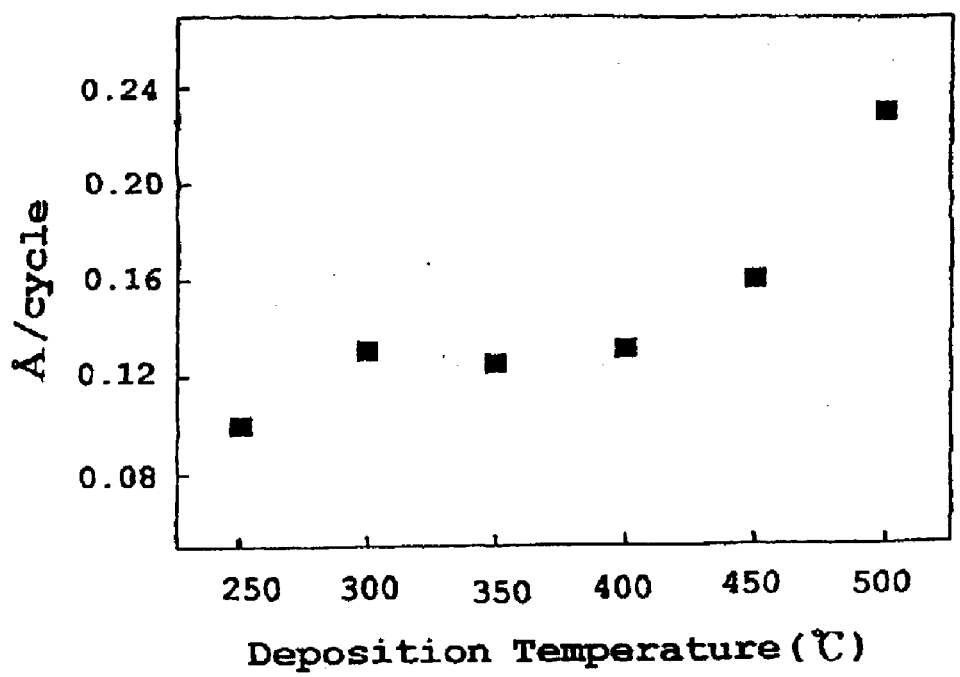
FIG. 3: the deposition rate of the zirconium silicate thin layer obtained in Example 2 according to deposition temperature.

The silicate thin layer thus obtained was subjected to XPS (X-ray photoelectron spectroscopy) analysis to measure the elemental composition and deposition rate/cycle as function of the deposition temperature. The results are shown in FIGS. 2 and 3, which exhibit that the zirconium content (Zr/(Zr+Si)) of the thin layer decreases, and the deposition rate increases as the deposition temperature increases. There are no significant changes in the elemental composition and deposition rate at a deposition temperature in the range of 300 to 400° C.

Figure 4:
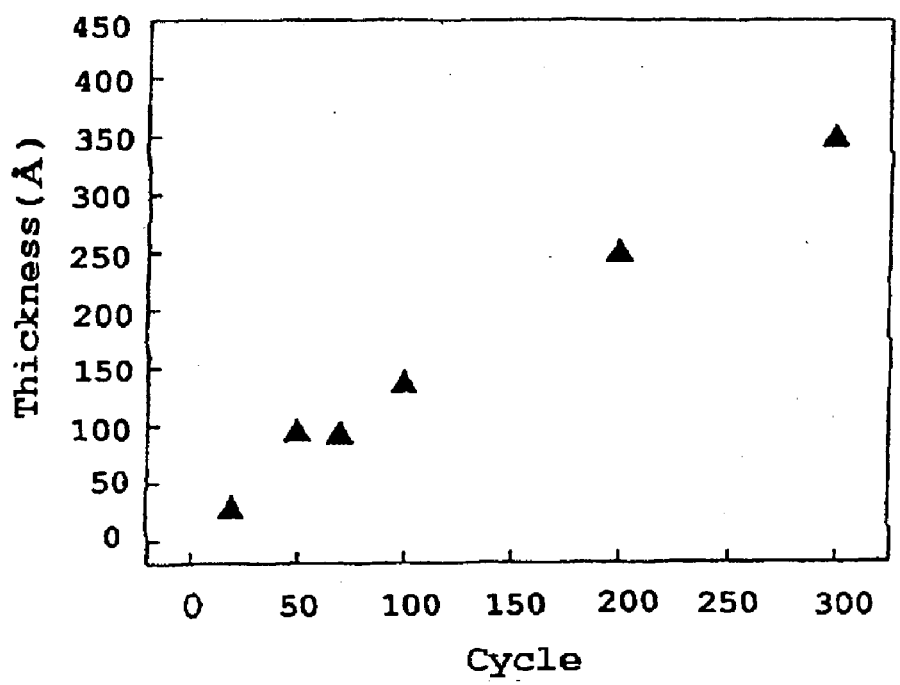
FIG. 4: the deposition rate of the zirconium silicate thin layer obtained in Example 2 according to cycle number.

Further, the deposition rate (the change in the thin layer thickness with cycle number) of the zirconium silicate thin layer was examined under a fixed deposition temperature of 350° C. The results are shown in FIG. 4, which demonstrates that the atomic layer chemical vapor deposition method of the present invention can be reproducibly conducted to control the layer thickness which increases linearly with cycle number.

EXAMPLE 3

Deposition of a Zirconium Silicate Thin Layer Using $ZrCl_2(N(Si(CH_3)_3)_2)_2$

ALCVD was carried out according to the same method described in Example 2 except for the use of $ZrCl_2(N(Si(CH_3)_3)_2)_2$ as a source gas. The deposition temperature was varied ranging 0 to 350° C.

Figure 5:
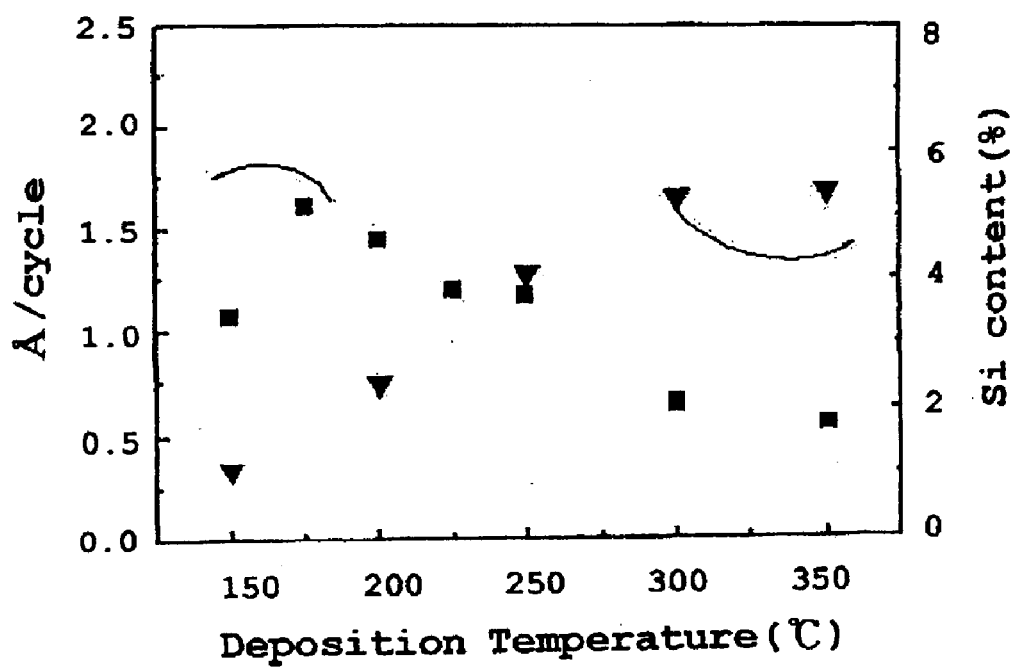
FIG. 5: the change of deposition rate and silicon content of the zirconium silicate thin layer obtained in Example 3 with deposition temperature.

The silicate thin layer thus obtained was subjected to XPS analysis to measure the elemental composition and deposition rate as function of deposition temperature. The results are shown in FIG. 5, which exhibits that the silicon content in the thin layer and the deposition rate/cycle increase as the deposition temperature increases. The maximum deposition rate observed to be 1.6 Å per cycle at 175° C.

Figure 6:
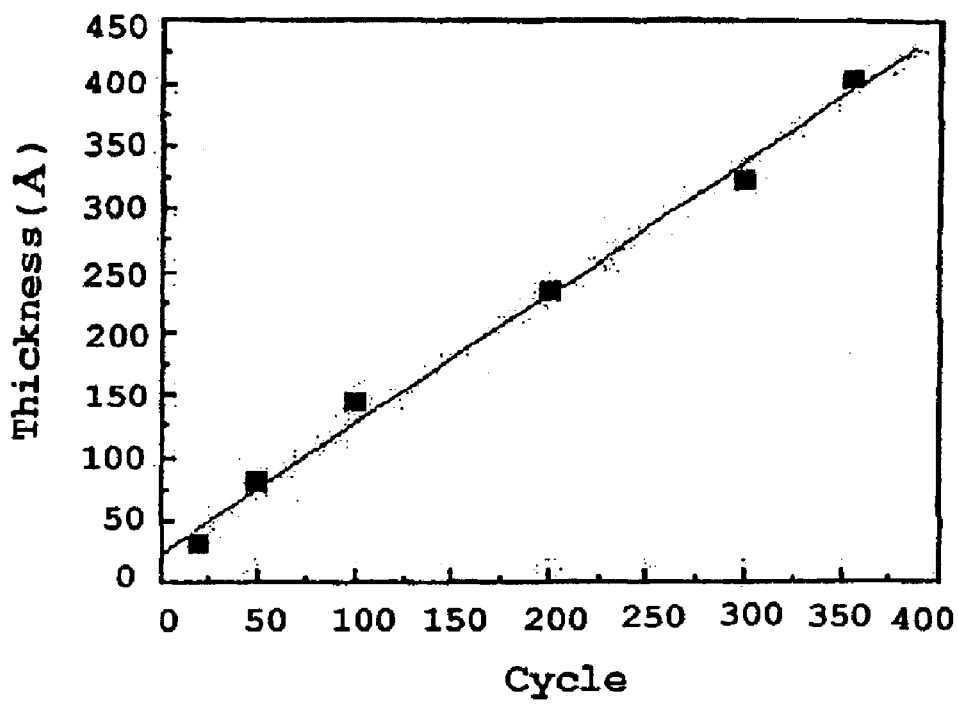
FIG. 6: the deposition rate of the zirconium silicate thin layer obtained in Example 3 according to cycle number.

Further, the deposition rate (the change in the thin layer thickness with cycle number) of the zirconium silicate thin layer was examined under a fixed deposition temperature of 250° C. The results are shown in FIG. 6, which demonstrates that the atomic layer chemical vapor deposition method can be reproducibly conducted to control the layer thickness which increases linearly with cycle number. At this time, the deposition rate is maintained at 1.1 Å per cycle.

Figure 7:
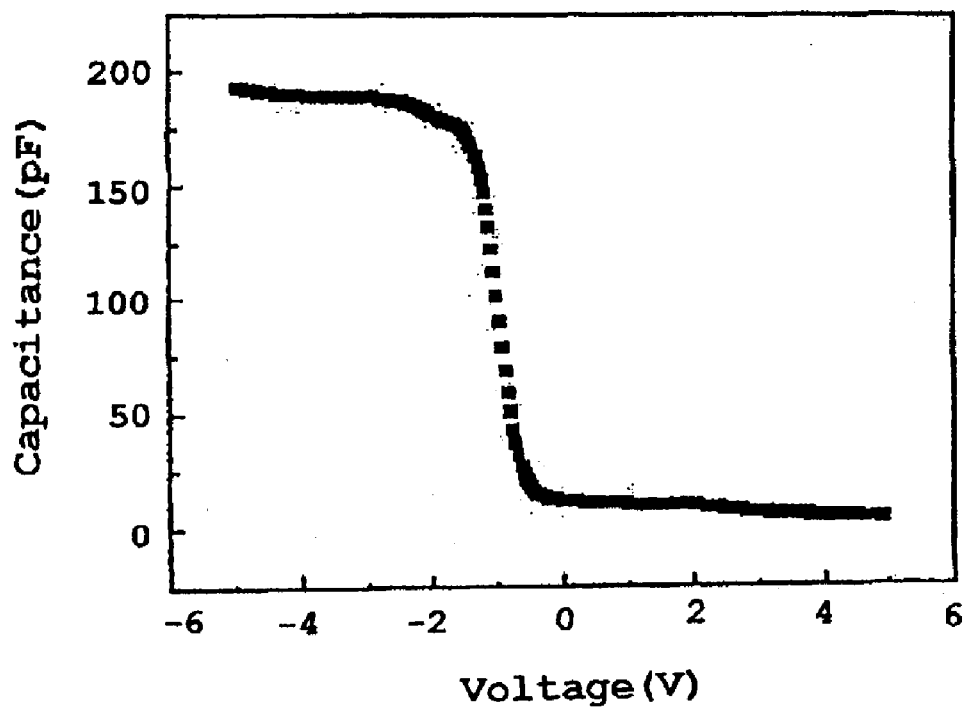
FIG. 7: the capacitance change of the zirconium silicate thin layer obtained in Example 3 with voltage.

Furthermore, in order to examine electrical properties, a thin layer was deposited to a thickness of 400 Å at 250° C., and its capacitance and voltage were measured. The results are shown in FIG. 7. The dielectric constant calculated from the results of FIG. 7 is 18, which is lower than that of pure zirconium oxide layer (dielectric constant: 20~25).

To increase silicon content in the thin layer, it was possible to introduce another silicon compound such as silicon alkoxide.

While the embodiments of the subject invention have been described and illustrated, it is obvious that various changes and modifications can be made therein without departing from the spirit of the present invention which should be limited only by the scope of the appended claims.

What is claimed is:

1. A method for atomic layer deposition (ALD) of a metal silicate thin layer which comprises contacting the vapor of an organometal complex of Formula 1 with a substrate and contacting the substrate with the vapor of an oxidant to increase silicon content in the thin layer:

<Formula 1>

$(X)_{a-b}\text{-}M(Y\text{-}(Si(R)_3)_m)_b$ wherein M is a trivalent or a tetravalent metal ion;

R is $C_{1-4}$ alkyl;

X is halogen or $C_{1-4}$ alkyl;

Y is N;

a is 3 and b is an integer ranging from 1 to 3 when M is a trivalent metal ion, or a is 4 and b is an integer ranging from 1 to 4 when M is a tetravalent metal ion; and m is 2.

2. The method of claim 1, wherein the organometal complex of Formula 1 is selected from the group consisting of $\text{Zr-}(N(Si(CH_3)_3)_2)_4$, $\text{ZrCl}_2(N(Si(CH_3)_3)_2)_2$, $\text{Hf-}(N(Si(CH_3)_3)_2)_4$, and $\text{HfCl}_2(N(Si(CH_3)_3)_2)_2$.

3. The method of claim 1, wherein the substrate is heated at a temperature ranging from 200 to 700°C.

4. The method of claim 1, wherein the oxidant is a metal alkoxide complex of Formula 5.

<Formula 5>

$M(OR)_d$ wherein M is a trivalent or a tetravalent metal ion;

R is $C_{1-4}$ alkyl; and d is 3 when M is a trivalent metal ion, or 4 when M is a tetravalent metal ion.

5. A method for preparing an organometal complex of Formula 2, which comprises reacting a compound of Formula 3 with a compound of Formula 4 in an organic solvent.

<Formula 2>

$(X)_{a-b}\text{-}M\text{-}(N\text{-}(Si(R)_3)_2)_b$

<Formula 3>

$Z(N(Si(R)_3)_2)$

<Formula 4>

$MX_c$ wherein M, R, X, a and b are the same as defined in claim 1;

Z is a monovalent metal ion;

c is 3 when M is a trivalent metal, or 4 when M is a tetravalent metal.

6. A metal silicate thin layer prepared by the method of claim 1.

7. A semiconductor device comprising the metal silicate thin layer of claim 6 as a gate insulating layer.

* * * * *